United States Patent [19]
White

[11] 3,997,914
[45] Dec. 14, 1976

[54] ANALOG ENCODER DECODER CIRCUIT

[75] Inventor: Jack R. White, Camarillo, Calif.

[73] Assignee: The United States of America as represented by the Secretary of the Navy, Washington, D.C.

[22] Filed: Feb. 2, 1976

[21] Appl. No.: 654,132

[52] U.S. Cl. .................................... 360/27; 360/67
[51] Int. Cl.² .......................................... G11B 5/02
[58] Field of Search ................... 360/25, 27, 67, 68

[56] References Cited
UNITED STATES PATENTS

| | | | |
|---|---|---|---|
| 3,041,415 | 6/1962 | Gratian | 360/27 |
| 3,379,839 | 4/1968 | Bennett | 360/27 |
| 3,657,489 | 4/1972 | Clark, Jr. | 360/27 |

Primary Examiner—Vincent P. Canney
Attorney, Agent, or Firm—Richard S. Sciascia; Joseph M. St.Amand; Darrell E. Hollis

[57] ABSTRACT

An analog encoder/decoder circuit for use with an instrumentation recorder which folds the recorded signal over and reuses the same voltage-controlled oscillator range three times at three different gains, thereby increasing the dynamic range to over 10,000. Depending on the level of the input signal, a first multiplexer selects one of three amplifier gains for amplifying the input signal prior to recording. Taken together, the three amplifier gains comprise a piece-wise linear approximation of a logarithmic curve. After playback or demodulation by the recorder, one of three corresponding inverse gain amplifiers are selected for amplifying the playback signal by a second multiplexer whereby the output signal is substantially identical to the input signal.

11 Claims, 2 Drawing Figures

| INPUT SIGNAL LEVEL, $e_{IN}$ | AMPLIFIER | SIGNAL TO RECORDER, $e_{REC}$ |
|---|---|---|
| $e_{IN} < V_1$ | 1 | $e_{REC} = G_1 e_{IN}$<br>$= 10 e_{IN}$ |
| $V_1 < e_{IN} < V_2$ | 2 | $e_{REC} = G_2 e_{IN} - G_2 V_1 + G_1 V_1$<br>$= -2 e_{IN} + 12 V_1$ |
| $V_2 < e_{IN}$ | 3 | $e_{REC} = G_4 e_{IN} - G_4 V_2 + G_2 V_2 - G_2 V_1 + G_1 V_1$<br>$= \frac{1}{3} e_{IN} - \frac{7}{3} V_2 + 12 V_1$ |

ANALOG ENCODER DECODER CIRCUIT

BACKGROUND OF THE INVENTION

1. Field of the Invention

This invention relates generally to electronic circuits used to expand the amplitude dynamic range of an instrumentation tape recorder and more particularly to such circuits employing piece-wise linear approximations.

2. Description of the Prior Art

The conventional method of expanding the amplitude dynamic range of instrumentation tape recorders includes the use of a logarithmic gain curve for recording. This has the effect of boosting low level signals above recorder noise and suppressing high level signals so that greater input signal swing can be achieved before maximum deviation of a recorder voltage-controlled oscillator is reached. At playback, an anti-log gain curve is used so that the net result will be a linear output signal. However, the gain curves from such logarithmic systems are extremely difficult to accurately calibrate.

SUMMARY OF THE INVENTION

The present invention comprises an analog encoder/decoder circuit for use with an instrumentation recorder which folds the recorded signal over and reuses the same voltage-control oscillator range three times at three different gains, thereby increasing the dynamic range to over 10,000. A comparator circuit generates a set of control signals dependent on the level of the input signal. The control signals input a multiplexer which selects the input signal one of three amplifiers for recording on a first track. The gains of the three amplifiers taken together form a piece-wise linear approximation of a logarithmic curve. The control signals are summed and recorded on a record track. After playback, one of three corresponding inverse gain amplifiers are selected for amplifying the playback signal by a second multiplexer. The multiplexer is controlled by a set of control signals generated from the recorded summed control signals. The multiplexer output is substantially identical to the input signal.

Accordingly, one object of the present invention is to expand the amplitude dynamic range of an instrumentation tape recorder.

Another object of the present invention is to provide accurate calibration.

Another object of the present invention is to minimize the number of components necessary for operation.

One other object of the present invention is to provide a smaller, less expensive and reliable circuit.

Other objects and a more complete appreciation of the present invention and its many attendant advantages will develop as the same becomes better understood by reference to the following detailed description when considered in connection with the accompanying drawings in which like reference numerals designate like parts throughout the figures thereof and wherein.

DETAILED DESCRIPTION OF THE PREFERRED EMBODIMENT

The analog encoder/decoder circuit utilizes a compression technique which folds the recorded signal over and reuses the same voltage-controlled oscillator range three times at three different gains. A good instrumentation recorder typically has a dynamic range of about 300 from the recorder noise level to the largest signal that can be recorded. The analog encoder/decoder circuit permits the recording and reproduction of signals with a dynamic range of over 10,000.

Figure 1:
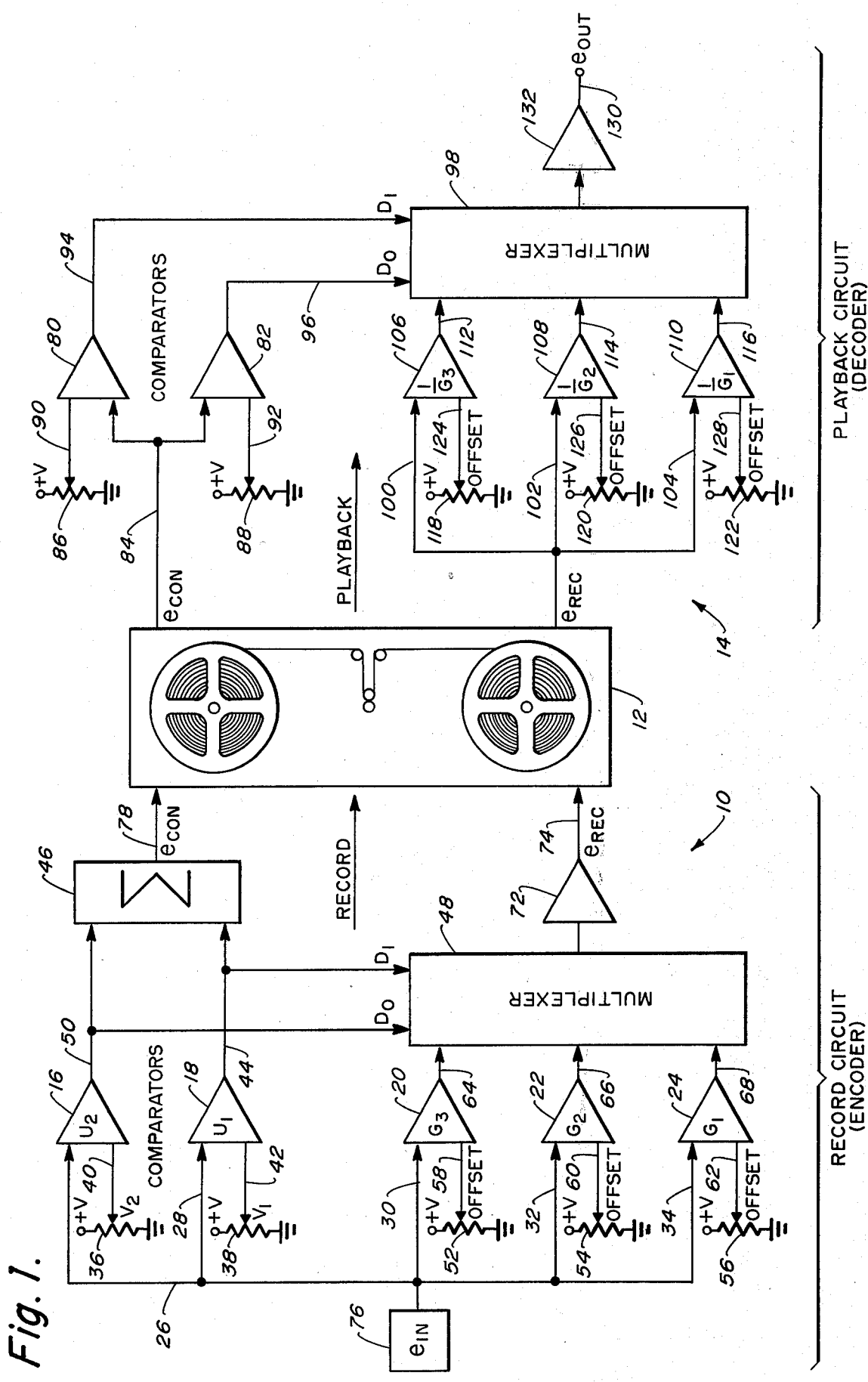
FIG. 1 is a block diagram of a specific embodiment of the present invention.

Now turning to FIG. 1, one embodiment of the present invention is illustrated comprising a record circuit or encoder circuit 10, an instrumentation recorder mechanism 12, and a playback circuit or decoder circuit 14. Input signal $e_{in}$ inputs comparators 16 and 18 and amplifiers 20, 22 and 24 via lines 26, 28, 30, 32 and 34, respectively.

Potentiometer 36 supplies a DC reference voltage level $V_2$ which inputs comparator 16 via line 40. Potentiometer 38 provides a DC reference voltage level $V_1$ to comparator 18 via line 42. DC reference signal $V_2$ is greater than DC reference signal $V_1$. When the amplitude of the input signal on line 28 is greater than DC reference signal $V_1$, comparator 18 outputs a control signal on line 44. The control signal on line 44 is a fixed DC level whenever the input signal on line 28 is greater than the reference signal on line 42. Whenever the input signal on line 28 is less than the DC reference signal $V_1$ on line 42, a zero voltage level appears on line 44. The control signal on line 44 inputs summer 46 and multiplexer 48.

When the input signal on line 26 is greater than the DC reference signal $V_2$ on line 40, comparator 16 outputs a control signal onto line 50. The control signal on line 50 is a fixed DC level whenever the input signal on line 26 is greater than the DC reference signal V2 on line 40. The control signal on line 50 is a zero voltage level whenever the input signal on line 26 is less than the DC reference signal $V_2$ on line 40. The control signals on line 50 input summer 46 as well as multiplexer 48.

The input signal $E_{in}$ inputs amplifier 20 via line 30, amplifier 22 via line 32, and amplifier 24 via line 34. A DC offset signal from potentiometer 52 inputs amplifier 20 via line 58. A DC offset signal from potentiometer 54 inputs amplifier 22 via line 60. A DC offset signal from potentiometer 56 inputs amplifier 24 via line 62. Amplifiers 20, 22 and 24 input multiplexer 48 via lines 64, 66, and 68, respectively.

Figure 2:
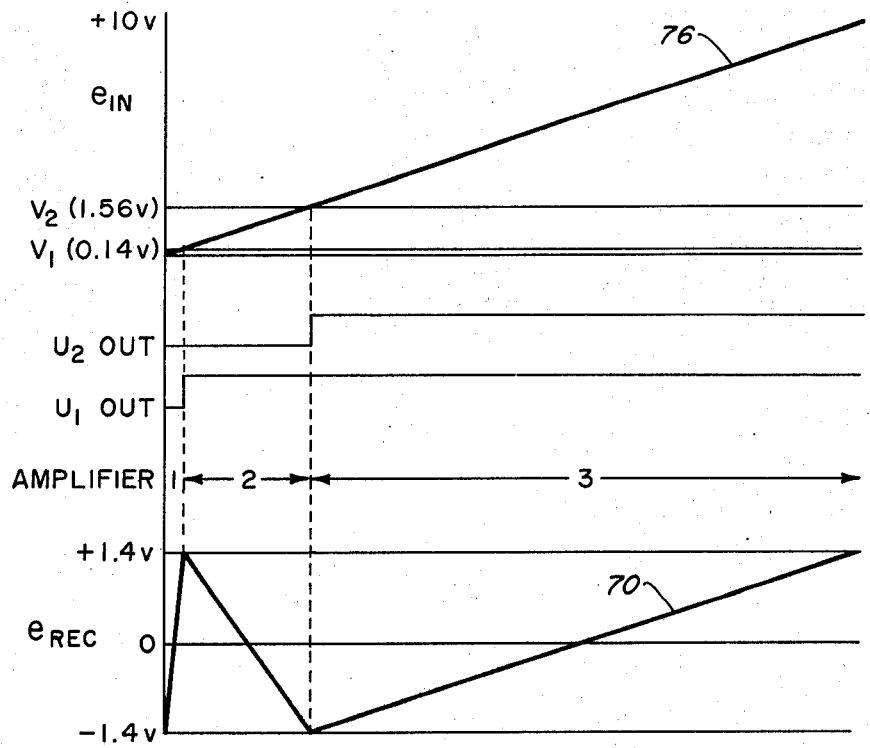
FIG. 2 is a graphic representation of the signal levels and gains of the circuit components illustrated in the embodiment of FIG. 1.

When taken together, the gains of amplifiers 20, 22, and 24 form a piece-wise linear approximation of a logarithmic curve. This piece-wise linear approximation is illustrated by curve 70 in FIG. 2. As shown in FIG. 2, amplifier 24 has a gain of 10, amplifier 22 has a gain of −2, and amplifier 20 has a gain of one-third. Multiplexer 48 passes one of the signals on line 64, 66 or 68 to instrumentation recorder 12 via amplifier 72 and line 74, depending on the levels of control signals $D_0$ and $D_1$.

A description of the operation of record circuit 10 follows. The amplitude dynamic range of the instrumentation tape recorder 12 is increased in two ways. First, the low signal level and is extended by improving the effective signal to recorder noise ratio. Low level signals are recorded at a high gain and played back at a reduced gain. Second, the high signal level end is extended by the reuse of the voltage-control-oscillator range and by the reduction in gain, thereby increasing the allowable swing of the input signal.

The record circuit 10 is designed for input signals with a range of zero to 10 volts. Frequency response is from DC to an upper frequency determined by the instrumentation recorder 12 bandwidth.

A ramp voltage illustrated in FIG. 2 as graph 76 is a good input signal for illustrating the gain switching and fold overs. For an input signal with an amplitude less than DC reference signal level $V_1$, both comparators 16 and 18 have low or zero outputs on lines 50 and 44, respectively. Multiplexer 48 selects the signal on line 68 from amplifier 24 to pass to recorder 12. Since the gain of amplifier 24 is 10, the signal on line 74 $e_{rec}$ is ten times the input signal $e_{in}$.

The levels of DC reference signal $V_1$ on line 42 and DC reference signal $V_2$ on line 40 are chosen to fold the record signal $e_{rec}$ on line 74 over at the voltage-controlled oscillator band edges. Instrumentation recorder 12 is set for maximum deviation at 1 volt RMS input ($\pm 1.414V$) then DC reference signal $V_1$ on line 42 is set at 0.1414V and DC reference signal $V_2$ on line 40 is set at 1.56V. An initial offset of $-0.1414V$ DC is given to the input signal to start the record signal $e_{rec}$ on line 74 at the lower band edge.

As the input signal on line 28 rises above $V_1$, the DC reference signal on line 42, comparator 18 outputs a control signal having a fixed DC level on line 44. Meanwhile, the control signal on line 50 remains at a zero DC level or low. Multiplexer 48 then selects the siganl on line 66 for amplifier 22 to appear as a record signal $e_{rec}$ on line 74. Amplifier 22 has a gain of negative 2, so the direction of the record signal $e_{rec}$ on line 74 is reversed.

When the input signal 76 rises above the level of the DC reference signal on line 40, $V_2$, both comparators 18 and 16 output a fixed DC level on lines 44 and 50, respectively. In this situation, multiplexer 48 selects the signal from amplifier 20 on line 64 to appear as record signal $e_{rec}$ on line 74. Amplifier 20 has a gain of one-third, so the record signal $e_{rec}$ on line 74 again reverses direction to cross the voltage-controlled oscillator range for the third time. The high end limit is reached when the input signal 76 equals 10V and the record signal $e_{rec}$ on line 74 reaches 1.414V.

Amplifiers 20, 22 and 24 have DC offset voltage inputs on lines 58, 60 and 62, respectively, so that there is no step discontinuity in the record signal $e_{rec}$ on line 74 as multiplexer 48 switches back and forth between amplifiers 20, 22 and 24. Normally, the offset signal on line 62 is zero. The offset signal on line 60 is a function of the gain of amplifier 24 and the level of the DC reference signal $V_1$ on line 42. The offset voltage signal on line 58 is a function of the gain of amplifier 24 and amplifier 22 as well as the DC reference signal on line 42 and the DC reference signal on line 40. Expressing the DC offset signals on lines 58 and 60 as functions of the amplifier gains and the comparator thresholds makes setting each foldover point a single potentiometer adjustment. However, the sequence of setting potentiometer 36 and 38 is important. Potentiometer 36 should be set before potentiometer 38.

The chart in FIG. 2 gives the equations for the record signal $e_{rec}$ on line 74 for the three regions of interest as the input signal 76 linearly increases from zero to 10 volts.

The outputs of comparators 16 and 18 on lines 50 and 44, respectively, are summed by summer 46 to form a three level summed control signal appearing on line 78 indicating whether amplifier 20, 22 or 24 was selected. The summed control signal on line 78 is recorded on a separate track from the recorded signal $e_{rec}$ on line 74. The summed control signals on line 78 and the recorded signal $e_{rec}$ on line 74 are recorded simultaneously.

The playback circuit 14 or decoder circuit shown in FIG. 1 includes a pair of comparators 80 and 82. Inputing comparators 80 and 82 on line 84 is the summed control signal recorded by recorder 12 from line 78. A DC reference signal from potentiometer 86 inputs comparator 80 via line 90. A DC reference signal from potentiometer 88 inputs comparator 82 via line 92. The outputs of comparators 80 and 82 on lines 94 and 96 input multiplexer 98.

The recorded signal $e_{rec}$ which was recorded by instrumentation recorder 12 from line 74 inputs amplifiers 106, 108 and 110 on lines 100, 102 and 104, respectively. The outputs of amplifiers 106, 108 and 110 appear on lines 112, 114, and 116, respectively. Lines 112, 114 and 116 input multiplexer 98.

A DC offset signal is generated by potentiometer 118 and inputs amplifier 106 via line 124. A DC offset signal is generated by potentiometer 120 and inputs amplifier 108 via line 126. A DC offset signal is generated by potentiometer 122 and inputs amplifier 110 via line 128.

The operation of playback circuit or decoder circuit 14 follows. The DC reference signal voltage levels on lines 90 and 92 into comparators 80 and 82, respectively, are set such that the summed control signal on line 84 is detected so that the proper control signals appear on lines 94 and 96. The control signals on lines 94 and 96 are substantially identical to those on lines 50 and 44 just before they were summed. The control signals on lines 94 and 96 which input multiplexer 98 determine which amplifier section 106, 108 or 110 is selected to have its output signal appear on line 130 after passing through amplifier 132.

The gains of amplifier 106 is the inverse of the gain of amplifier 22. The gain of amplifier 108 is the inverse of the gain of amplifier 22. The gain of amplifier 110 is the inverse of the gain of amplifier 24. Thus, if the control signals on lines 94 and 96 ar both zero or low, then multiplexer 98 will select the signal on line 116 to appear on line 130. When the signal on line 96 is a fixed DC level or high, and the signal on line 94 is a zero level or low, multiplexer 98 will select the signal on line 114 to appear on line 130. When the signal on lines 96 and 94 are both high or both a fixed DC level, then multiplexer 98 will select the signal on line 112 to appear on the output 130.

Normally, the offset voltage appearing on line 128 is set to zero while the offset voltages on lines 126 and 124 are adjusted for smooth transition as multiplexer 98 selects between the signals on lines 112, 114, and 116 so that the output signal on line 130 is a glitch-free reproduction of the input signal 76.

One unique feature, among others, of the analog encoder/decoder circuit illustrated in FIG. 1 is its reuse of the same voltage-controlled oscillator range three times. Thus, the dynamic range is increased by a factor of three over any single range analog recording technique.

It will be appreciated by those having ordinary skill in the art that the complete circuit diagram of the embodiment illustrated in FIG. 1 includes such suitable and necessary biasing voltage sources as are usually provided in such circuits. All such biasing is not shown in FIG. 1.

Obviously numerous modifications and variations of the present invention are possible in light of the above teachings. It is therefore to be understood that within the scope of the appended claims the invention may be practiced otherwise than as specifically described herein.

What is claimed is:

1. An analog encoder/decoder for expanding the amplitude dynamic range of instrumentation tape recorders comprising:
   a. means for providing an input signal;
   b. a plurality of first amplifying means each receiving said input signal for producing a plurality of first amplified output signals, each of said plurality of first amplifying means providing a different signal gain, said signal gains of said plurality of first amplifying means forming a piece-wise linear approximation of a logarithmic curve;
   c. means connected to receive said input signal for generating a plurality of first d-c control signals that are a function of the amplitude of said input signal;
   d. summing means being connected to receive said first d-c control signals for summing said first d-c control signals, said summing means having an output upon which a summed d-c control signal appears;
   e. first switch means being connected to receive said d-c control signals and said first amplified output signals for passing one of said first amplified output signals in response to said first control signals to a first common output terminal;
   f. recording means having at least two recording tracks, a first track being connected for recording said summed d-c control signal, a second track being connected for recording said first amplified output signal appearing on said first switch means output.

2. The apparatus of claim 1 wherein said first d-c control signal generating means includes:
   a. means for generating a plurality of first d-c reference signals;
   b. a plurality of first comparators equal in number to said plurality of first d-c reference signals, each said first comparator being connected to receive a respective first d-c reference signal and said input signal, each said first comparator having an output upon which a first fixed d-c level control signal appears when said input signal's amplitude exceeds said respective first d-c reference signal.

3. The apparatus of claim 2 wherein said first switch means includes a first multiplexer connected to receive said first fixed d-c level control signals from said first comparator outputs and said first amplified output siganls, said first multiplexer passing one of said first amplified output signals to said first common output terminals depending on the levels of said first control signals.

4. The apparatus of claim 2 wherein:
   a. said first d-c reference signal generating means includes means for generating a pair of d-c reference signals; and
   b. wherein said plurality of first comparators includes a pair of comparators.

5. The apparatus of claim 1 wherein said plurality of first amplifying means includes a first, second and third individual amplifier.

6. The apparatus of claim 5 wherein said first, second and third individual amplifiers have respective gains of positive ten, negative two, and positive one-third.

7. The apparatus of claim 1 further including means for providing a plurality of first d-c offset signals, said plurality of first d-c offset signals providing means being equal in number to said plurality of first amplifying means, said plurality of first d-c offset signals respectively inputing said plurality of first amplifying means such that the continuity of said piece-wise linear approximation is maintained.

8. The apparatus of claim 1 further including:
   a. playback means coupled to said recording means for substantially reproducing said summed control signal and said first amplified output signal that was passed to said first common output terminal;
   b. means connected to receive said reproduced summed control signal for generating a plurality of second control signals from said summed control signal substantially identical to said first control signals;
   c. a plurality of second amplifying means each receiving said first amplified output signal for producing a plurality of second amplified output signals, said plurality of second amplifying means being equal in number to said plurality of first amplifying means, each said second amplifying means having an inverse gain from a respective first amplifying means;
   d. second switch means connected to receive said second control signals and said second amplified output signals for passing one of said second amplified output signals in response to said second control signals to a second common output terminal, said signal appearing on said second common output terminal being substantially identical to said input signal.

9. The apparatus of claim 8 wherein said second control signal generating means includes:
   a. means for generating a plurality of second d-c reference signals;
   b. a plurality of second comparators, equal in number to said plurality of second d-c reference signals, each said second comparator being connected to receive said reproduced summed control signal and a respective second d-c reference signal, each said second comparator having an output upon which a second fixed d-c level control signal appears when said reproduced summed control signal's amplitude exceeds said second d-c reference signal.

10. The apparatus of claim 9 wherein said second switch means includes a second multiplexer connected to receive said second fixed d-c level control signals from said second comparator outputs and said second amplified output signals, said second multiplexer passing one of said second amplified output signals to said second common output terminal, depending upon the levels of said second control signals.

11. The apparatus of claim 8 further including means for providing a plurality of second d-c offset signals, said plurality of second d-c offset signals providing means being equal in number to said plurality of second amplifying means, said plurality of second d-c offset signals respectively inputing said plurality of second amplifying means such that the continuity of said piece-wise linear approximation is maintained.

* * * * *